United States Patent
Kuo

(10) Patent No.: US 7,495,335 B2
(45) Date of Patent: Feb. 24, 2009

(54) METHOD OF REDUCING PROCESS STEPS IN METAL LINE PROTECTIVE STRUCTURE FORMATION

(75) Inventor: I-Ling Kuo, Lugang Township, Changhua County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 284 days.

(21) Appl. No.: 11/131,111

(22) Filed: May 16, 2005

(65) Prior Publication Data
US 2006/0258143 A1 Nov. 16, 2006

(51) Int. Cl.
*H01L 23/48* (2006.01)
(52) U.S. Cl. .............. 257/750; 257/739; 257/758; 257/762; 257/773; 257/774; 257/776; 257/E23.02; 257/E23.173; 257/E23.174
(58) Field of Classification Search ............ 257/42–47, 257/200–201, 388, 407, 412, 442, 614–616, 257/677, 734–786, E23.02; 438/85, 104, 438/575, 580, 582, 602–606, 610
See application file for complete search history.

(56) References Cited

U.S. PATENT DOCUMENTS

| | | | | |
|---|---|---|---|---|
| 5,172,212 A | * | 12/1992 | Baba ........................... | 257/738 |
| 5,235,212 A | * | 8/1993 | Shimizu et al. .............. | 257/780 |
| 5,346,858 A | * | 9/1994 | Thomas et al. .............. | 438/669 |
| 5,656,863 A | * | 8/1997 | Yasunaga et al. ............ | 257/778 |
| 5,894,170 A | * | 4/1999 | Ishikawa ..................... | 257/775 |
| 6,265,300 B1 | * | 7/2001 | Bhansali et al. ............. | 438/612 |
| 6,897,570 B2 | * | 5/2005 | Nakajima et al. ........... | 257/786 |
| 2001/0008311 A1 | * | 7/2001 | Harada et al. ............... | 257/758 |

* cited by examiner

*Primary Examiner*—Jasmine J Clark
(74) *Attorney, Agent, or Firm*—Tung & Associates

(57) ABSTRACT

A method of forming a protective structure on a top metal line on an interconnect structure is disclosed. The method includes providing a plate opening in the passivation layer on the top metal line and forming a protective plate in the plate opening on the top metal line.

20 Claims, 8 Drawing Sheets

METHOD OF REDUCING PROCESS STEPS IN METAL LINE PROTECTIVE STRUCTURE FORMATION

FIELD OF THE INVENTION

The present invention relates to methods for fabricating integrated circuit devices on semiconductor wafers. More particularly, the present invention relates to a method of reducing the number of process steps required for the formation of top metal interconnect lines' associated protective structures on a semiconductor wafer by forming a protective plate bounded by a passivation layer to protect a top metal interconnect line.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. This may include the use of a dual damascene process. A typical dual damascene process flow is as follows: IMD Deposition--> VIA Photo/Etch--> Metal pre-patterning--> Metal Trench Photo/Etch--> PVD Barrier (TaN etc)/Seed Dep. (Cu)--> Cu electroplating (ECP)--> Cu CMP The numerous processing steps outlined above are used to cumulatively apply multiple electrically conductive and insulating layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner. The various layers define circuit components or devices such as transistors.

After the individual devices have been fabricated on the substrate, they must be connected together to perform the desired circuit functions. This interconnection process is generally known as "metallization" and is performed using a number of different photolithographic, deposition, and removal techniques. In a common interconnection process, two interconnect channels of conductor materials are separated by interlayer dielectric layers in vertically separated planes perpendicular to each other and interconnected by a vertical connection, or "via", at their closest point FIGS. 1A-1G illustrate sequential process steps carried out according to a conventional method to form a protective aluminum bonding pad and dual passivation layers for a top metal line in a conventional metal interconnect structure 10. The structure 10 typically includes multiple dielectric layers 12a-12f, respectively, which are sequentially deposited on a wafer substrate (not shown) and each other. A bottom metal line 16a, a middle metal line 16b and a top metal line 16c are formed in the dielectric layers 12b, 12d and 12f, respectively. Bottom vias 14a connect the bottom metal lines 16a to device features (not shown) fabricated in or on the wafer substrate. In similar fashion, middle vias 14b connect the middle metal lines 16b to the bottom metal lines 16a, and top vias 14c connect the top metal lines 16c to the middle metal lines 16b.

As shown in FIG. 1A, after completion of a top metal line 16c, a bottom passivation stop layer 18 and a bottom passivation layer 20 are deposited on the top dielectric layer 12f and top metal line 16c. As shown in FIG. 1B, a photoresist layer 22 is then deposited on the bottom passivation layer 20 and patterned to form photoresist openings 23 corresponding to the location and size of a protective aluminum bonding pad to be subsequently formed. As shown in FIG. 1C, the bottom passivation layer 20 is then etched to form a pad opening 21 corresponding to the size and location of the photoresist opening 23. This is followed by stripping of the photoresist layer 22 from the bottom passivation layer 20 and removal of the bottom passivation stop layer 18 from the top metal line 16C. An aluminum pad 26 is next formed in the pad opening 21 of the bottom passivation layer 20, on top of the top metal line 16c, as shown in FIG. 1D. A photoresist layer (not shown) is provided on the aluminum pad 26, which is then etched in the desired configuration, after which the photoresist layer is stripped.

As shown in FIG. 1E, a top passivation layer 28 is next formed on the aluminum pad 26 and bottom passivation layer 20. As shown in FIG. 1F, a photoresist layer 30 patterned with an opening 31 is next formed on the top passivation layer 28, and the underlying top passivation layer 28 is etched to form an opening 29 therein. As shown in FIG. 1G, the photoresist layer 30 is next stripped from the top passivation layer 28. Finally, SiON is removed from the pad 26, followed by argon treatment and wet stripping to remove residual polymer residues from the structure 10. The top passivation layer 28 prevents inadvertent scratching and peeling of the aluminum pad 26, whereas the aluminum pad 26 prevents corrosion of the top metal line 16c.

Packaging follows in which an IC chip (not shown) of which the interconnect structure 10 is a part is assembled into a higher-order electronic structure. This involves the wire bonding of an internal lead (not shown) of a leadframe to the aluminum pad 26. The leadframes are electrically attached to components in the electronic structure.

The dual passivation process heretofore described with respect to FIGS. 1A-1G requires 13 separate process steps and contributes to an excessively long cycle time. Furthermore, the process results in a high fluorine concentration in the aluminum pad 26, increasing the likelihood of pad crystal (F-pad) defects which may cause bondability failure during subsequent chip packaging.

Therefore, a method of reducing the number of process steps required for the top metal interconnect lines' associated protective/bonding structures formed on a semiconductor wafer is needed.

Accordingly, an object of the present invention is to provide a method which includes the formation of a protective plate which is bounded by a passivation layer to protect a top metal interconnect line in a metal interconnect structure from oxidation, corrosion, scratching and peeling.

Another object of the present invention is to provide a method which simplifies the process used to form top metal interconnect lines associated protective/bonding structures, thus substantially reducing the process cycle time.

Still another object of the present invention is to provide a method which eliminates the need to use a dual passivation scheme to avoid aluminum pad scratching and peeling.

Yet another object of the present invention is to provide a method which eliminates the need to use an aluminum pad and dual passivation structure to prevent corrosion of a top metal line by using a protective plate bounded by a passivation layer to protect the top metal line.

SUMMARY OF THE INVENTION

In accordance with these and other objects and advantages, the present invention is generally directed to a novel method of reducing process steps required for the fabrication of top metal lines associated protective/bonding structures in semiconductor devices. The method includes providing a passivation layer on a top metal line, etching a plate opening in the passivation layer, and forming a protective plate on the top metal line, in the plate opening. The method significantly shortens the cycle time required for fabrication of top metal lines' associated protective and bonding structures by replacing a conventional aluminum bonding pad with a silver bonding plate and eliminating the need for a conventional dual passivation scheme which is conventionally used to protect the aluminum bonding pad from scratching and peeling. Furthermore, the method eliminates high fluorine concentrations which frequently characterize a conventional aluminum bonding pad, thus preventing pad crystal (F-pad) defects and bondability failure during subsequent chip packaging.

BRIEF DESCRIPTION OF THE DRAWINGS

The invention will now be described, by way of example, with reference to the accompanying drawings, in which.

DETAILED DESCRIPTION OF THE INVENTION

Figure 1A:
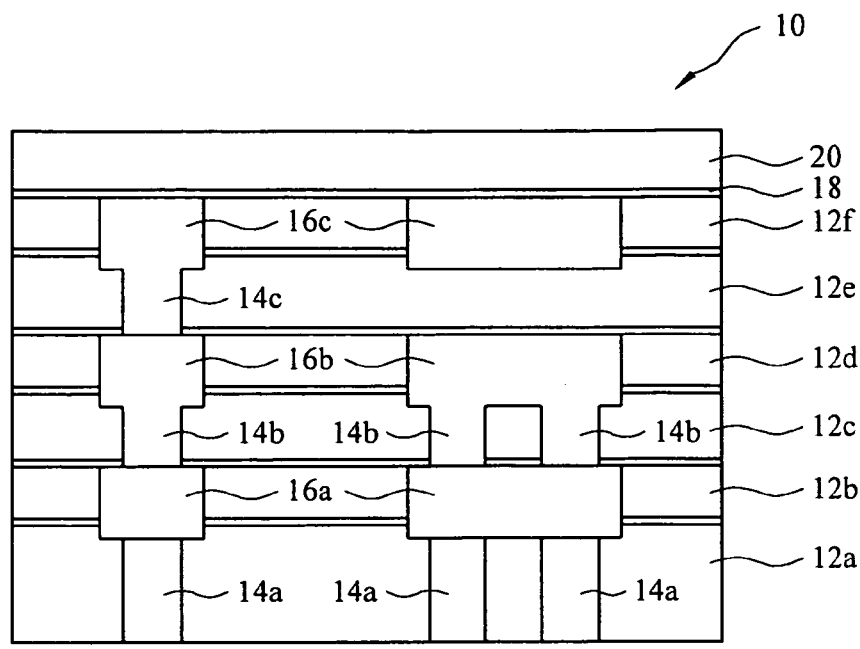
FIGS. 1A-1G are cross-sectional views illustrating a conventional dual passivation and aluminum pad formation technique on a top metal line.
Figure 1B:
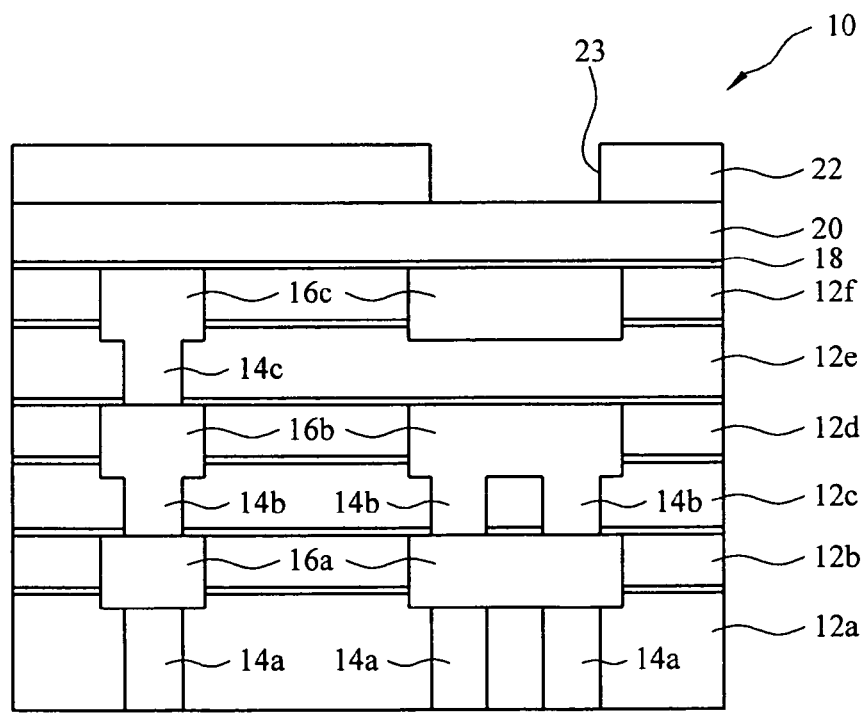
Figure 1C:
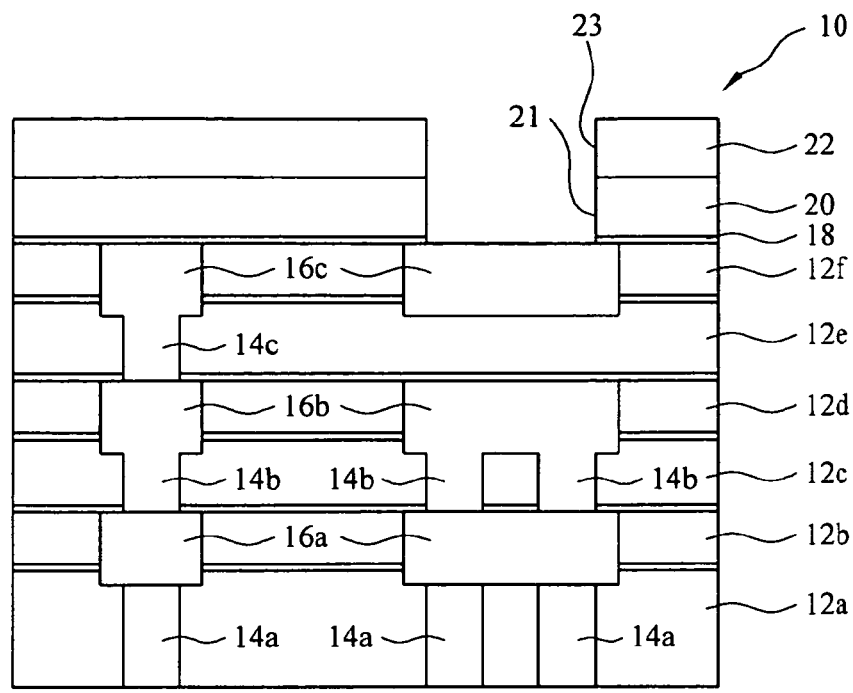
Figure 1D:
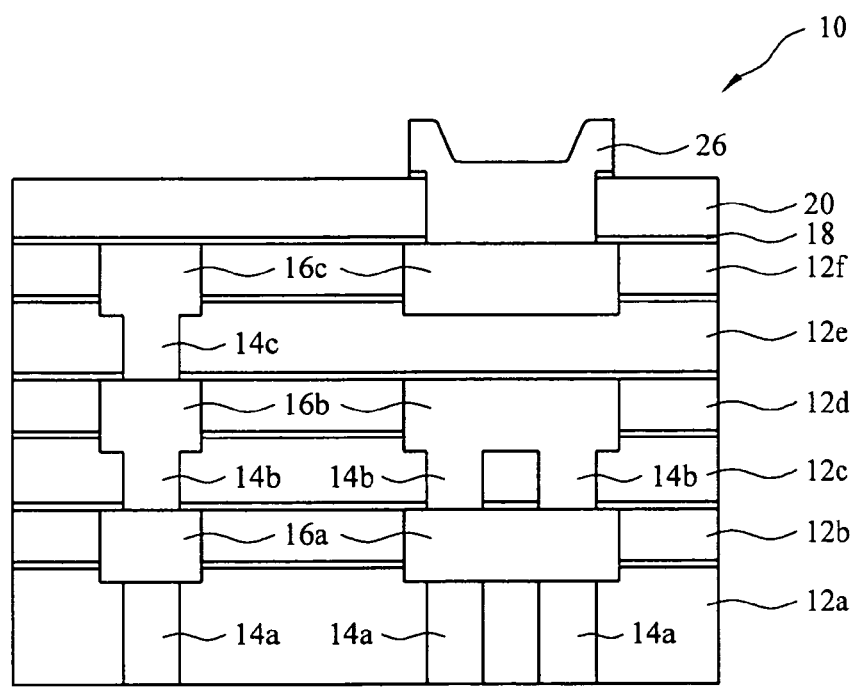
Figure 1E:
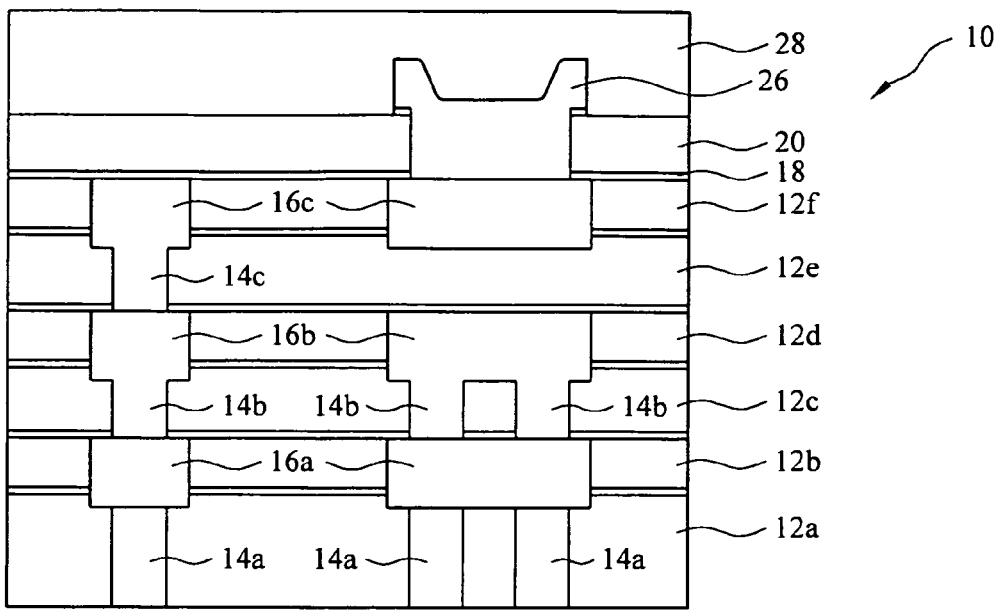
Figure 1F:
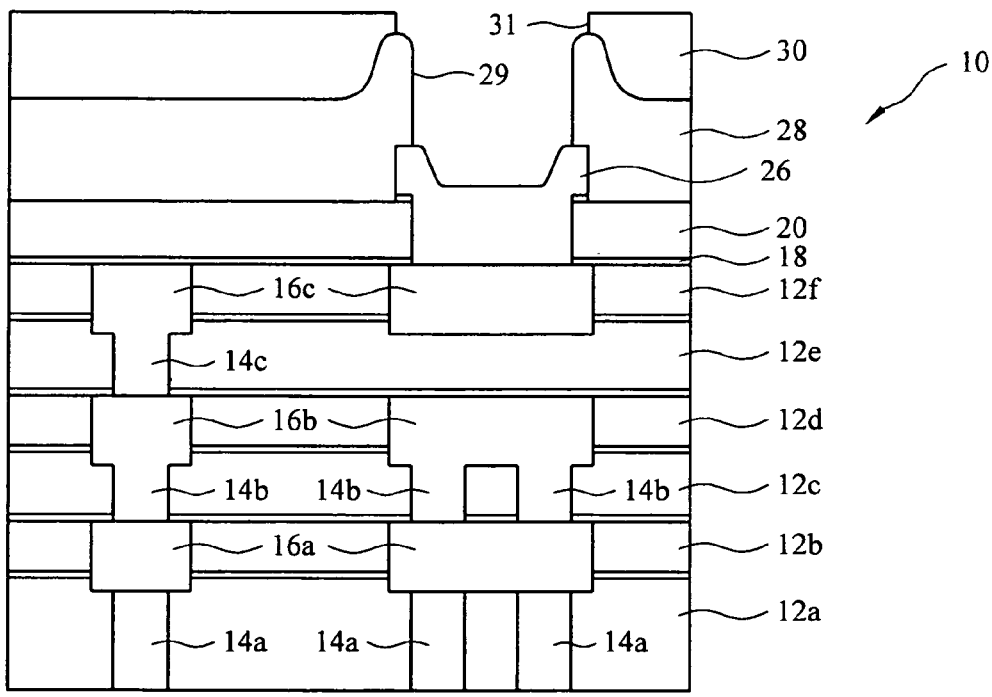
Figure 1G:
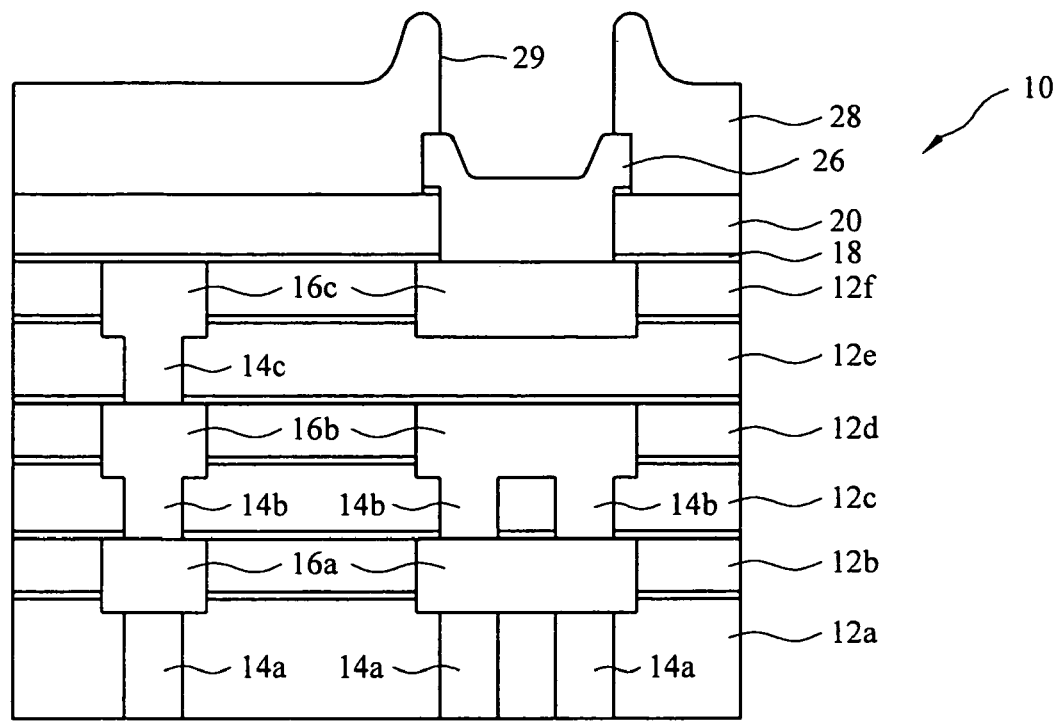

Referring to FIGS. 2A-2F, sequential process steps carried out in implementation of a method of reducing process steps in the formation of protective structures for a metal line according to the present invention is shown. Unless otherwise noted, the method may be carried out using conventional deposition and etching techniques known by those skilled in the art. An exemplary interconnect structure 40 includes multiple dielectric layers 42a 42f, respectively which are sequentially deposited on a wafer substrate 41 and on each other using conventional deposition techniques. Bottom vias 44a extend through the dielectric layer 42a and connect a bottom metal line 46a in the dielectric layer 42b to device features (not shown) fabricated in or on the wafer substrate (not shown). Middle metal lines 46b are formed in the dielectric layer 42d. Middle vias 44b connect the middle metal lines 46b to the bottom metal lines 46a. A top via 44c extending through the dielectric layer 42e connects a top metal line 46c to the middle metal lines 46b. The metal lines 46a-46c and vias 44a-44c are typically fabricated at each level using a dual damascene process. Top metal lines 46c and 46d are formed in the top dielectric layer 42f. The top metal lines 46c and 46d may be, for example, Cu, Al, Ag, Au or Pt.

Figure 2A:
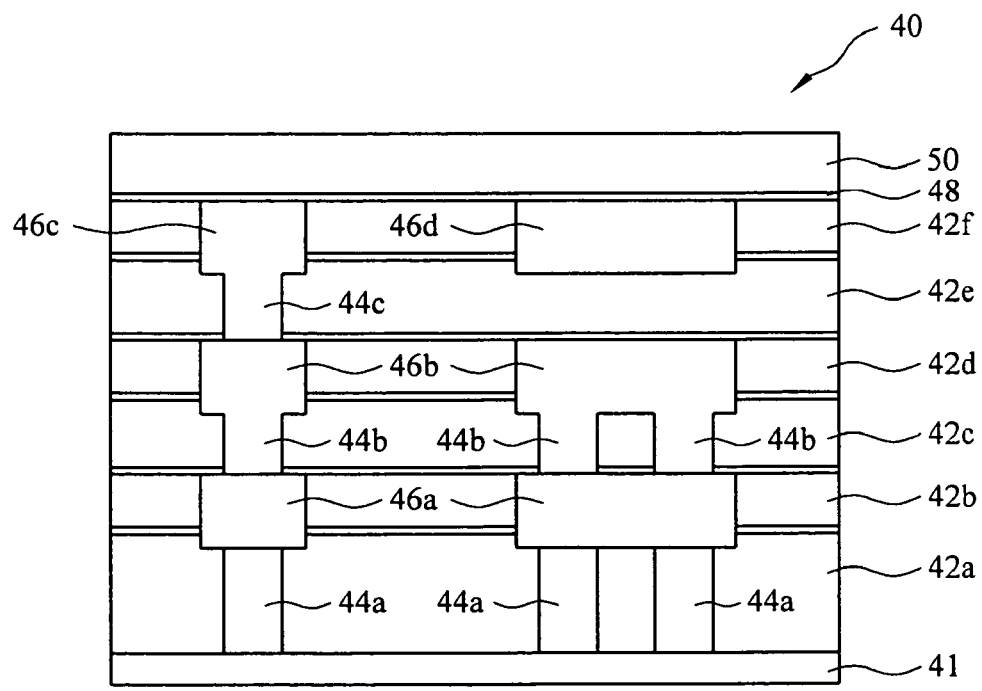
FIGS. 2A-2F are cross-sectional views illustrating a method of reducing process steps by fabricating a silver bonding plate on the top metal line in the plate opening of the passivation layer according to the present invention.

As shown in FIG. 2A, as a first step in the process according to the present invention, an etch stop layer 48 is formed on the upper surfaces of the top dielectric layer 42f and metal lines 46c and 46d. The etch stop layer 48 may be SiN, for example. A passivation layer 50 is next formed on the etch stop layer 48.

Figure 2B:
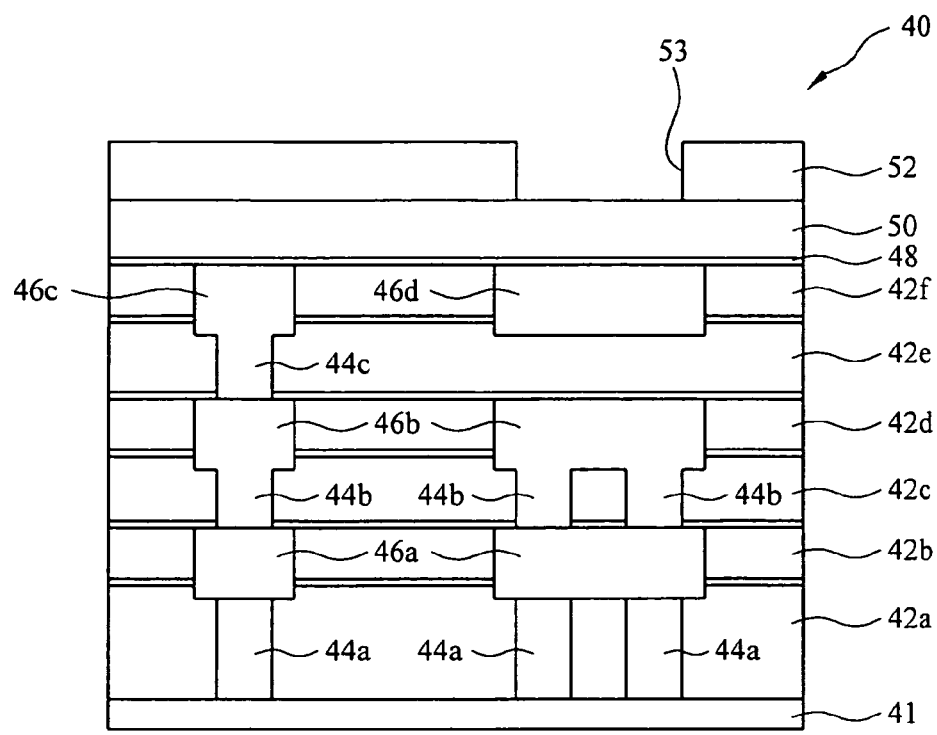

As shown in FIG. 2B, a photoresist layer 52 is next formed on the passivation layer 50, such as by using a spin-coating process, for example. The photoresist layer 52 is patterned to form one or multiple photoresist openings 53 therein. The size and location of each photoresist opening 53 corresponds to the size and location of a silver bonding plate to be subsequently formed on the top metal line 46d, as will be hereinafter described.

Figure 2C:
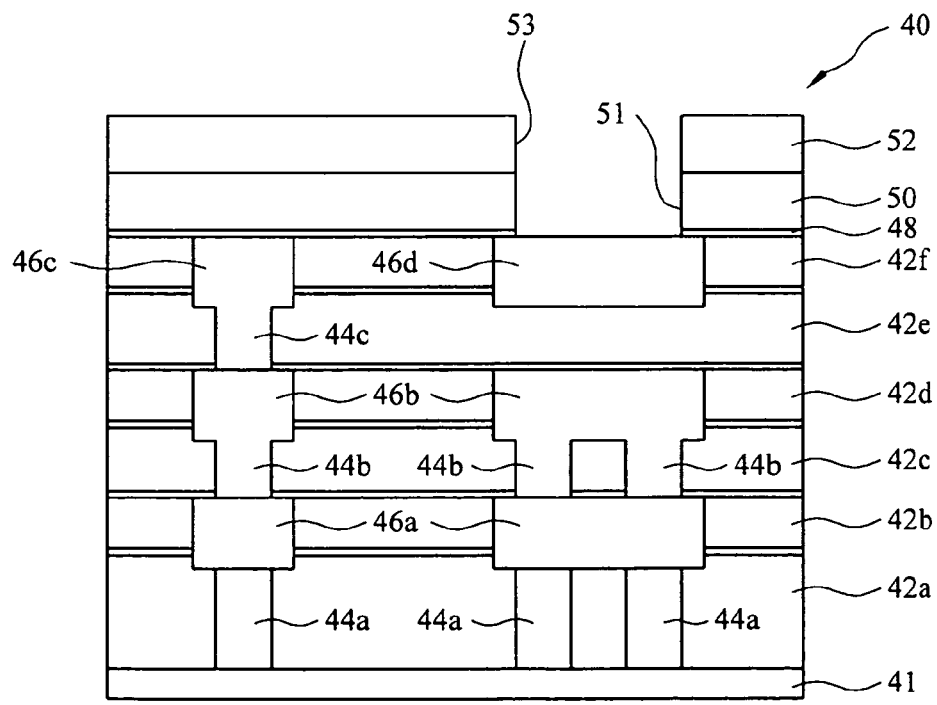
Figure 2D:
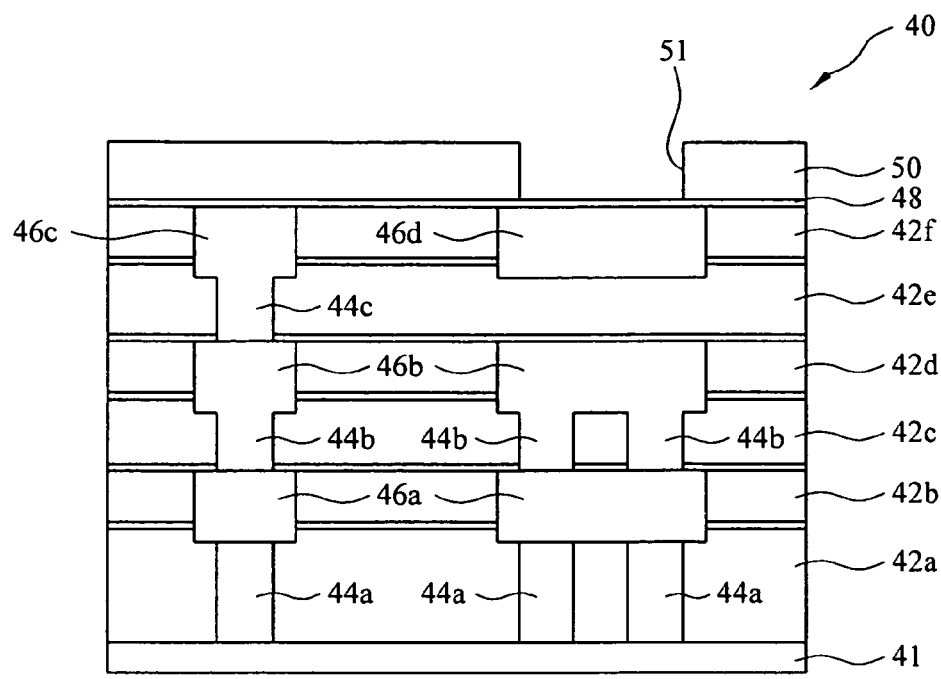
Figure 2E:
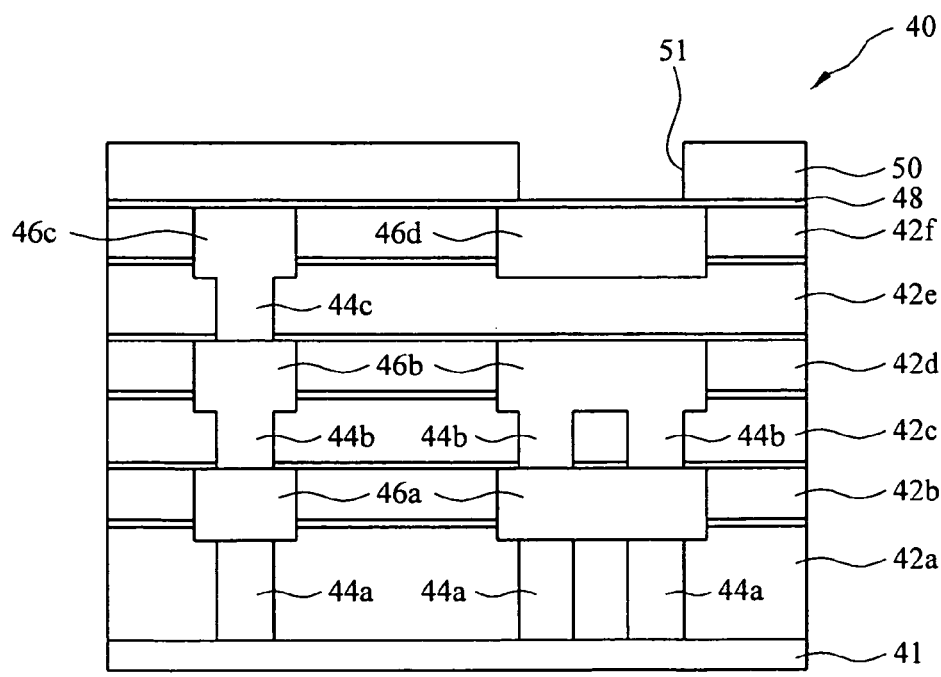

As shown in FIG. 2c the passivation layer 50 is then etched down to the etch stop layer 48 to form a plate opening 51 beneath the photoresist opening 53. The plate opening 51 extends through the passivation layer 50 and exposes the etch stop layer 48. As shown in FIG. 2D, the photoresist layer 52 (FIG. 2c) is next stripped from the underlying passivation layer 50. This process typically involves subjecting the photoresist layer 52 to a dry stripping step, followed by a wet-stripping step. Next, as shown in FIG. 2E, the etch stop layer 48 is removed to expose the top surface of the top metal line 46d through the plate opening 51. This may be followed by a dry and wet stripping process to remove polymer residues from the interconnect structure 40.

Figure 2F:
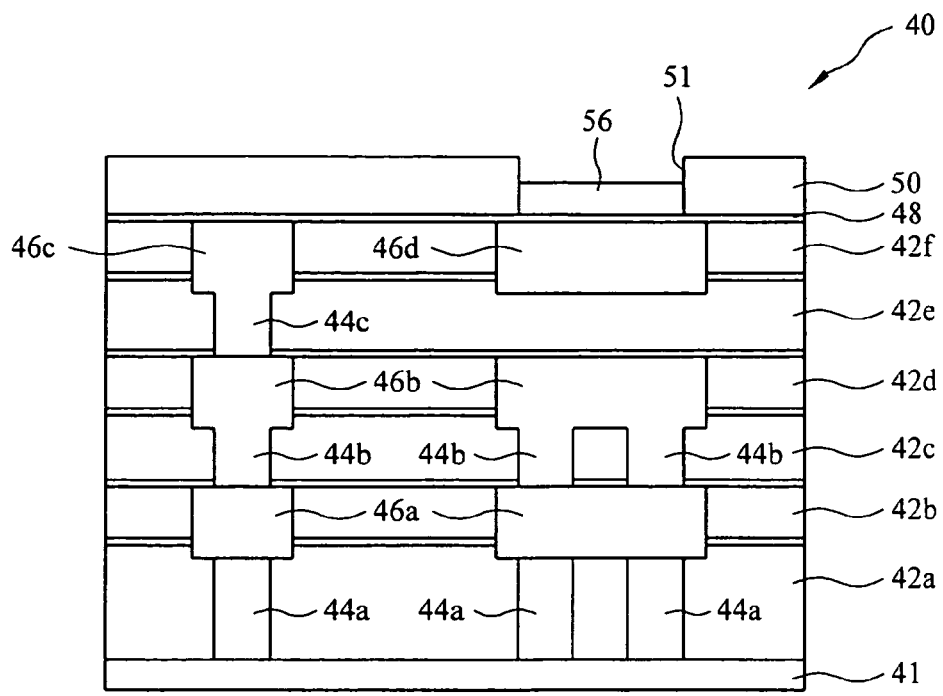

As shown in FIG. 2F, a protective plate 56 is next formed in the plate opening 51, on top of the top metal line 46d. This step may be carried out using an electrochemical plating technique, or alternatively, an electroless plating technique. The protective plate 56 may be a material such as Ag, an Ag alloy, Au, an Au alloy, Pt, a Pt alloy, a solder alloy or combinations thereof. Alternatively, the protective plate 56 may be multiple layers any of which may be a material such as Ag, an Ag alloy, Au, an Au alloy, Pt, a Pt alloy, a solder alloy or combinations thereof. The protective plate 56 may have a thickness about >300 angstroms or <15,000 angstroms.

After formation of the protective plate 56, the interconnect structure 40, which forms a part of one of multiple IC chips (not shown) fabricated on a semiconductor wafer (not shown), is bonded to an electronic structure (not shown). This involves the attachment, typically by gold wire, of a bonding wire (not shown) to the protective plate 56. The bonding wire is attached to a leadframe (not shown), which is electrically connected to the electronic structure. The protective plate 56 is compatible with the chip packaging process and is resistant to pad crystal (F-pad) defects which characterize conventional aluminum bonding pads. Furthermore, the protective plate 56 is effective to prevent oxidation, corrosion of the underlying top metal line 46d and avoids scratching and peeling which also characterize conventional aluminum bonding pads.

Figure 3:
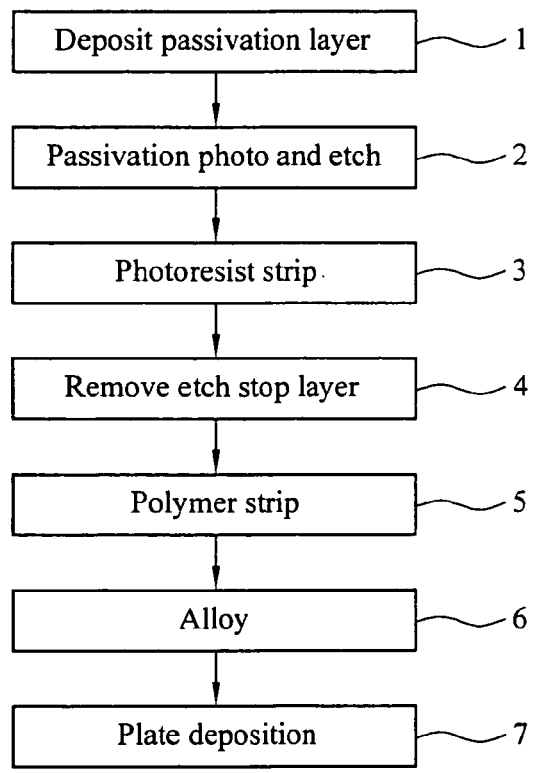
FIG. 3 is a flow diagram which illustrates sequential process steps carried out according to the present invention.

A flow diagram which summarizes sequential process steps carried out according to the method of the present invention is shown in FIG. 3. In process step 1, an etch stop layer and a passivation layer are sequentially deposited on a top metal line of a metal interconnect structure. In process step 2, a photoresist layer is patterned and developed on the passivation layer and a plate opening is etched in the passivation layer. In process step 3, the photoresist layer is stripped from the passivation layer. In process step 4, the etch stop layer is removed from the top metal line. In process step 5, a dry and wet stripping process is carried out to remove polymer residues from the interconnect structure. In process step 6, a protective plate is prepared to be deposited on top of the top metal line in the plate opening of the passivation layer.

Figure 4:
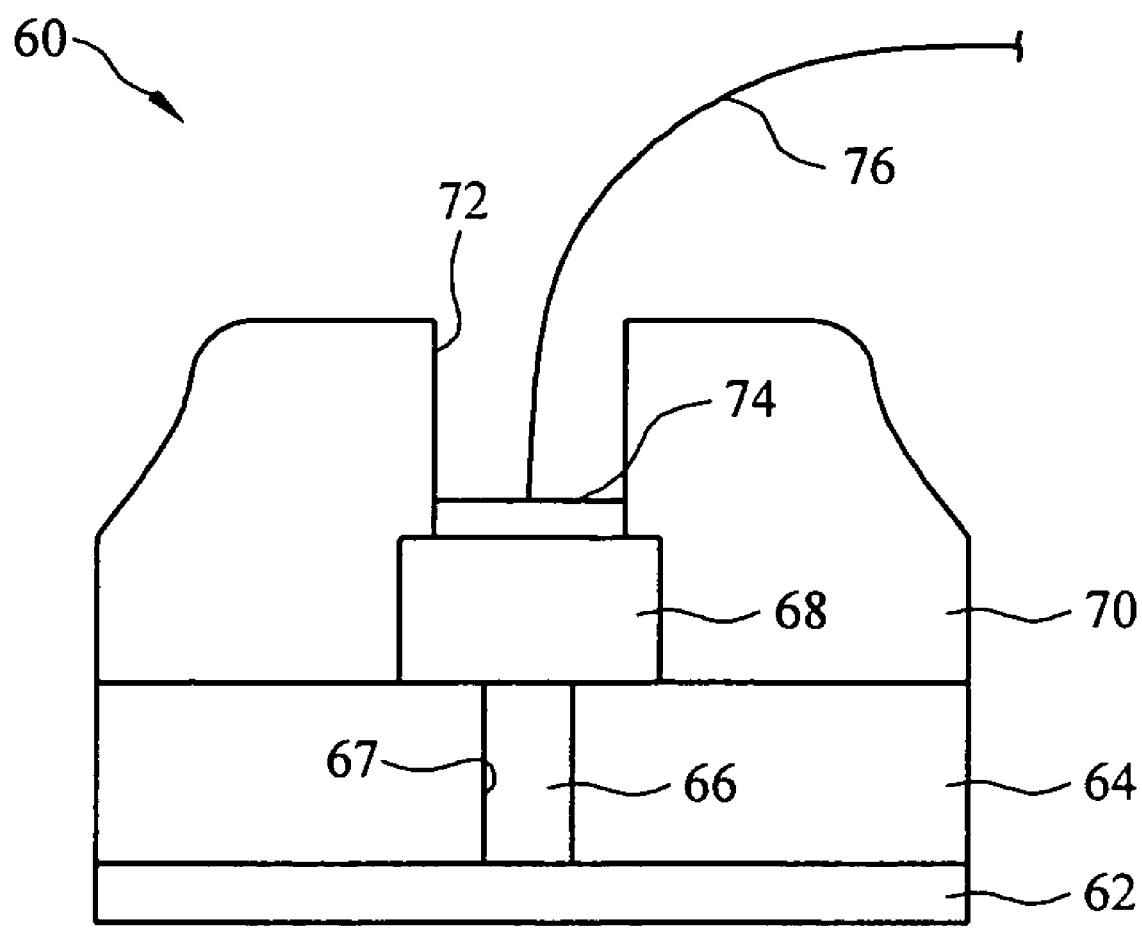
FIG. 4 is a schematic of a semiconductor device interconnect structure fabricated according to the present invention.

Referring next to FIG. 4, another embodiment of an interconnect structure 60 fabricated according to the present invention is shown. The interconnect structure 60 includes a substrate 62 which may be a silicon wafer substrate, a dielectric layer or a metal layer, for example. A dielectric layer 64, which may be an intermetal dielectric (IMD) or interlayer dielectric (ILD), is formed on the substrate 62. A metal plug 66 extends through a plug opening 67 etched through the dielectric layer 64. A metal line 68 is formed on the dielectric layer 64 and in electrical contact with the metal plug 66. The metal line may be Cu, Al, Ag, Au, Pt or AlCu, for example.

A passivation layer 70 is formed on the dielectric layer 64 and metal line 68. A plate opening 72 extends through the passivation layer 70. A protective plate 74 is formed in the plate opening 72, on top of the metal line 68. The protective plate 74 may be Ag, an Ag alloy, Au, an Au alloy, Pt, a Pt alloy, a solder alloy, or combinations thereof, for example, and may be a single or multiple layers. The protective plate 74 has a thickness of typically about 300~15,000 angstroms and may be formed using, for example, electrochemical plating or electroless plating. A bonding wire 76 may be bonded to the metal line 68 to connect the interconnect structure 60 to a leadframe (not shown) which is electrically connected to an electronic structure (not shown) of which the interconnect structure 60 is a part.

While the preferred embodiments of the invention have been described above, it will be recognized and understood that various modifications can be made in the invention and the appended claims are intended to cover all such modifications which may fall within the spirit and scope of the invention.

What is claimed is:

1. A protective structure on a top metal line on an interconnect structure, comprising:
   a substrate;
   a dielectric layer provided on said substrate;
   a metal plug provided in said dielectric layer;
   said top metal line provided on said metal plug;
   a passivation layer having a plate opening provided on said dielectric layer; and
   a noble metal protective plate in said plate opening on said top metal line, said protective plate upper surface over said top metal line to expose upper sidewall portions of said plate opening, said protective plate having sidewalls bounded by said plate opening.

2. The protective structure of claim 1 wherein said top metal line is a material selected from the group consisting of Cu, Al.

3. The protective structure of claim 1 wherein said passivation layer comprises a single passivation layer.

4. The protective structure of claim 1 wherein said protective plate is a material selected from the group consisting of Ag, an Ag alloy, Au, an Au alloy, Pt, a Pt alloy, a solder alloy, and combinations thereof.

5. The protective structure of claim 1 wherein said protective plate comprises multiple layers.

6. The protective structure of claim 1 wherein said protective plate comprises multiple layers and each of said multiple layers is a material selected from the group consisting of Ag, an Ag alloy, Au, an Au alloy, Pt, a Pt alloy, a solder alloy, and combinations thereof.

7. The protective structure of claim 1 wherein said protective plate has a thickness of less than about 15,000 angstroms.

8. The protective structure of claim 1 wherein said protective plate has a thickness of greater than about 300 angstroms.

9. The protective structure of claim 1 wherein said protective plate comprises electrochemical plating material.

10. The protective structure of claim 1 wherein said protective plate comprises electroless plating material.

11. A semiconductor device structure comprising:
    a substrate;
    a dielectric layer provided on said substrate;
    a metal plug provided in said dielectric layer;
    a metal line provided on said metal plug;
    a passivation layer having a plate opening provided on said dielectric layer; and
    a protective plate provided on said metal line in said plate opening, said protective plate upper surface over said top metal line to expose upper sidewall portions of said plate opening, said protective plate having sidewalls bounded by said plate opening;
    wherein said protective plate is a material selected from the group consisting of Ag, an Ag alloy, Au, an Au alloy, Pt, a Pt alloy, a solder alloy, and combinations thereof.

12. The semiconductor device structure of claim 11 wherein said metal line is a material selected from the group consisting of Cu, Al, Ag, Au and Pt.

13. The semiconductor device structure of claim 11 wherein said protective plate comprises multiple layers.

14. The semiconductor device structure of claim 11 wherein said protective plate comprises multiple layers and each of said multiple layers is a material selected from the group consisting of Ag, an Ag alloy, Au, an Au alloy, Pt, a Pt alloy, a solder alloy, and combinations thereof.

15. The semiconductor device structure of claim 11 wherein said protective plate has a thickness of less than about 15,000 angstroms.

16. The semiconductor device structure of claim 11 wherein said protective plate has a thickness of greater than about 300 angstroms.

17. The semiconductor device structure of claim 11 wherein said protective plate comprises electrochemical plating material.

18. The semiconductor device structure of claim 11 wherein protective plate comprises electroless plating material.

19. A semiconductor device structure comprising:
    a substrate;
    a dielectric layer provided on said substrate;
    a metal plug provided in said dielectric layer;
    a metal line provided on said metal plug;
    a passivation layer having a plate opening provided on said dielectric layer;
    a protective plate provided on said metal line in said plate opening, said protective plate upper surface over said top metal line to expose upper sidewall portions of said plate opening, said protective plate having sidewalls bounded by said plate opening;
    wherein said protective plate comprises multiple layers and each of said multiple layers is a material selected from the group consisting of Ag, an Ag alloy, Au, an Au alloy, Pt, a Pt alloy, a solder alloy, and combinations thereof.

20. The semiconductor device structure of claim 19 wherein said metal line is a material selected from the group consisting of Cu, Al, Ag, Au and Pt.

* * * * *